United States Patent

Shi et al.

(10) Patent No.: US 7,980,865 B2
(45) Date of Patent: Jul. 19, 2011

(54) SUBSTRATE WITH RAISED EDGE PADS

(75) Inventors: Wei Shi, Gilbert, AZ (US); Daoqiang Lu, Chandler, AZ (US); Qing Zhou, Chandler, AZ (US); Jiangqi He, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/315,854

(22) Filed: Dec. 22, 2005

(65) Prior Publication Data

US 2007/0155198 A1    Jul. 5, 2007

(51) Int. Cl.
*H01R 12/00* (2006.01)
(52) U.S. Cl. .......................... 439/71; 439/289
(58) Field of Classification Search ............ 439/71, 439/70, 68, 69, 525, 66, 289
See application file for complete search history.

(56) References Cited

U.S. PATENT DOCUMENTS

| | | | |
|---|---|---|---|
| 3,142,783 A * | 7/1964 | Warren | 361/761 |
| 3,994,552 A * | 11/1976 | Selvin | 439/278 |
| 5,176,530 A * | 1/1993 | Reylek et al. | 439/290 |
| 5,431,580 A * | 7/1995 | Tabata | 439/289 |
| 5,599,193 A * | 2/1997 | Crotzer | 439/66 |
| 5,899,757 A * | 5/1999 | Neidich et al. | 439/67 |
| 6,669,490 B1 * | 12/2003 | DelPrete et al. | 439/86 |
| 6,790,057 B2 * | 9/2004 | DelPrete et al. | 439/91 |
| 6,796,810 B2 * | 9/2004 | DelPrete et al. | 439/86 |
| 6,884,086 B1 | 4/2005 | Ruttan et al. | 439/66 |
| 6,969,270 B2 * | 11/2005 | Renfro et al. | 439/342 |
| 2004/0161953 A1 * | 8/2004 | MacLaren et al. | 439/65 |
| 2005/0239314 A1 * | 10/2005 | Malone et al. | 439/342 |

\* cited by examiner

*Primary Examiner* — T C Patel
*Assistant Examiner* — Travis Chambers
(74) *Attorney, Agent, or Firm* — Trop, Pruner & Hu, P.C.

(57) ABSTRACT

A separable electrical connection may be provided with a landside pad on one of two electrical components to be joined. The landside pad may be made up of two parts, including a flat portion and a raised edge formed on the flat portion. In some embodiments, the raised edge may have a closed geometric shape. Then, a socket contact engaging the junction between the flat portion and the raised edge is prevented from sliding off of the landside pad by the raised edge. In addition, dual areas of electrical connection can be established between both the flat portion and raised edge of the landside pad and the correspondingly shaped pair of portions on the socket. This increases the electrical efficiency of the connection and its security.

10 Claims, 3 Drawing Sheets

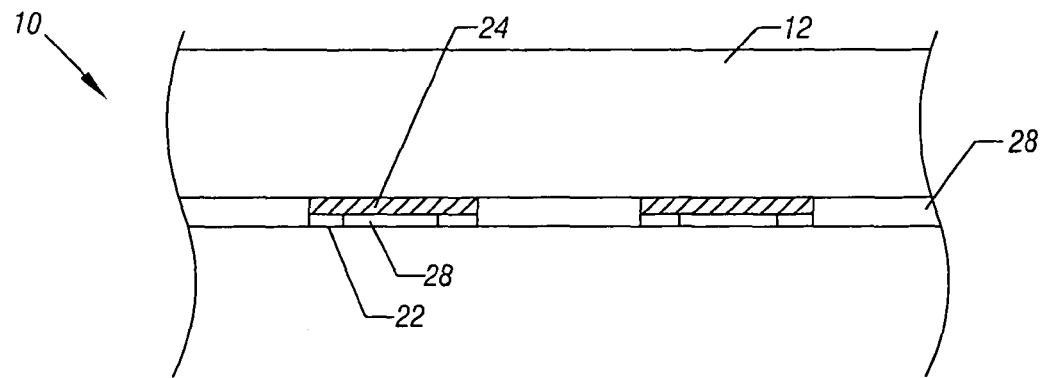
FIG. 4
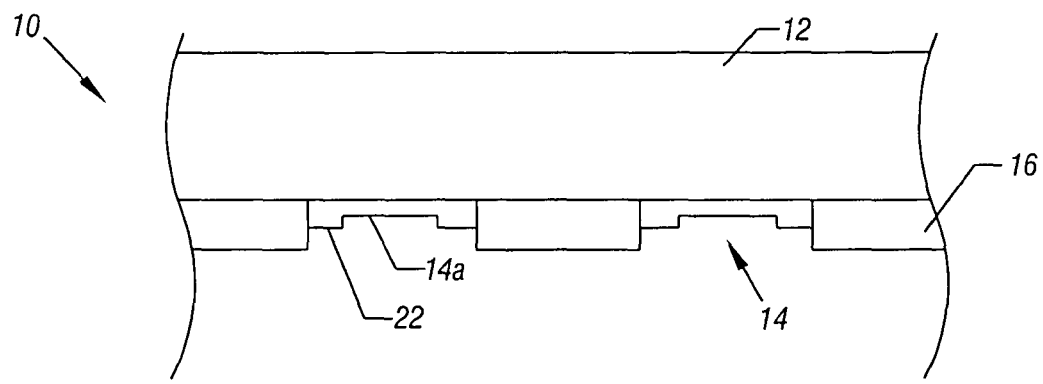
FIG. 5
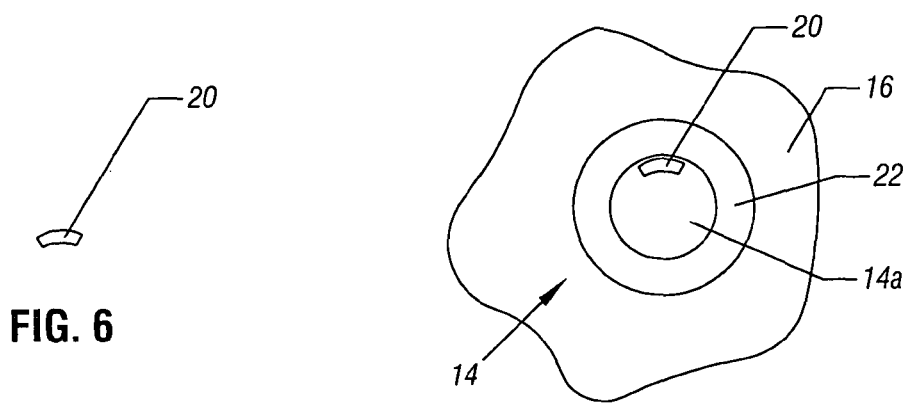
FIG. 6
FIG. 7

SUBSTRATE WITH RAISED EDGE PADS

BACKGROUND

This invention relates generally to separable electrical interconnection systems and, particularly, to electrical sockets for connecting two electrical components.

In conventional electrical sockets, a socket contact may contact a generally flat pad of a substrate. The pad, often called a landside pad, is connected to one electrical component and the socket contact is connected to another.

As substrate landside pads are shrunk to improve electrical performance, the socket contacts may tend to slide off the pads. In addition, while the pads are shrunk, the contact resistance between the socket contacts and the substrate landside pads may still be relatively high due to the small contact area.

BRIEF DESCRIPTION OF THE DRAWINGS

FIG. 4 is an enlarged, cross-sectional view at a subsequent stage in accordance with one embodiment of the present invention;

FIG. 5 is an enlarged, cross-sectional view at a subsequent stage in accordance with one embodiment of the present invention;

FIG. 6 is an end view of a socket contact in accordance with one embodiment of the present invention;

FIG. 7 is a cross-sectional view taken generally along the line 7-7 in FIG. 1;

DETAILED DESCRIPTION

Figure 1:
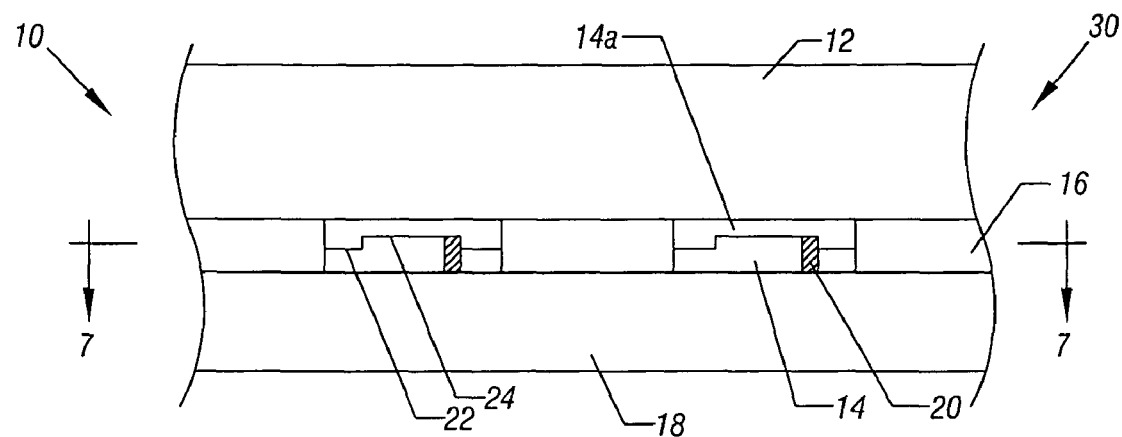
FIG. 1 is an enlarged, cross-sectional view of one embodiment of the present invention.

Referring to FIG. 1, a first electrical component 12 may be electrically coupled to a second electrical component 18. In one embodiment, the component 12 may be an integrated circuit package, such as a packaged processor. In one embodiment, the component 12 may be land grid array (LGA) package. In one embodiment, the component 18 may be a socket for an integrated circuit, such as a processor. In one embodiment, the component 18 may be a land grid array (LGA) socket.

Electrical sockets may be used to provide separable electrical connections between a variety of different electrical components, including integrated circuit package to motherboard. However, many other socket interconnections may also be contemplated.

The separable electrical connection 14 includes a generally U-shaped, downwardly projecting landside pad 14a and an upwardly projecting socket contact 20. Thus, the separable electrical connection 14 includes two interfitting parts which may be pluggingly interconnected by placing the component 12 on top of the component 18, for example, using a pick and place machine.

The landside pad 14a includes a flat, central disc portion 24 and a peripheral, raised ring 22, which may extend downwardly towards the component 18 relative to the flat disk portion 24. While a ring is shown, other closed shapes, such as triangles, rectangles, and ovals, may also be used. Also, open geometric shapes may be used.

As better shown in FIG. 7, the ring 22 surrounds the flat disc portion 24 of the landside pad 14a. The socket contact 20 (FIG. 6) is curved, in one embodiment, and may have a radius of curvature approximately the same as the radius of curvature of the ring 22. However, the contact 20 may be only a cylindrical segment, of about a 60° arc, in one embodiment. Using the cylindrical segment, as opposed to the entire cylinder, makes it easier to align and assemble the components 18 and 12.

Thus, contact may be achieved between the contact 20 and the upstanding portion of the ring 22, as well as between the flat end of the contact 20 and the flat disc portion 24 of the landside pad 14a. The components 12 and 18 may be held together through the application of an external load, for example, through springs.

This double contact area, in some embodiments, increases the extent of electrical connection and increases the electrical performance. Moreover, outward, disengaging sliding movement between the contact 20 and the landside pad 14a is effectively reduced or eliminated.

A solder resist 16 may be maintained between the components 12 and 18 in some embodiments. However, any insulator may also be used.

Figure 2:
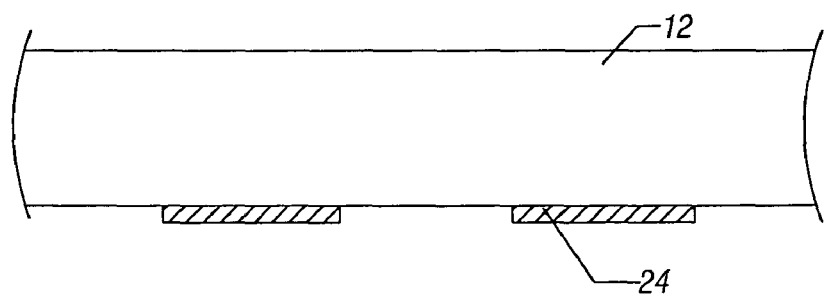
FIG. 2 is an enlarged, cross-sectional view at an early stage of manufacture of the embodiment shown in FIG. 1 in accordance with one embodiment of the present invention.

Referring to FIG. 2, initially, the electrical component 12 has flat disc portion 24 formed thereon. In practice, while only portions 24 are shown, a large number of such pads may be formed in an array in some embodiments.

Figure 3:
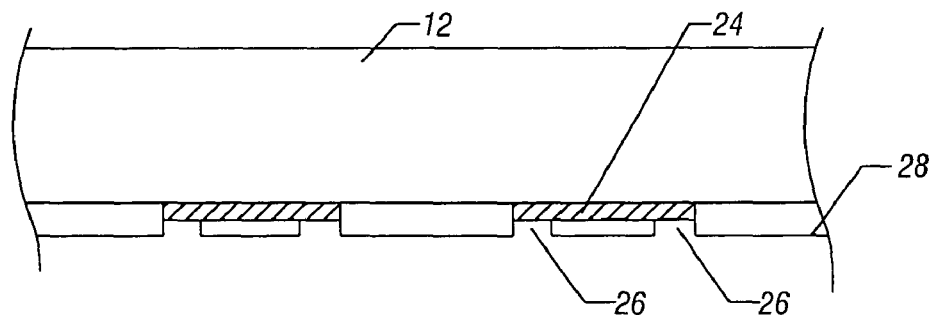
FIG. 3 is an enlarged, cross-sectional view at a subsequent stage in accordance with one embodiment of the present invention.

Next, as shown in FIG. 3, photoresist 28 may be deposited over the structure, patterned, and openings 26 formed. Then, as shown in FIG. 4, metal may be deposited into the openings 26. If the openings 26 are ring-shaped, the rings 22 may be formed by the metal deposition process. In one embodiment, the metal may be copper and may be formed by plating. The portion 24 may also be copper in one embodiment.

Referring now to FIG. 5, the photoresist 28 may be removed and a solder resist layer 16 may be applied so that only portions surrounding the landside pads 14a are coated with the solder resist.

Figure 8:
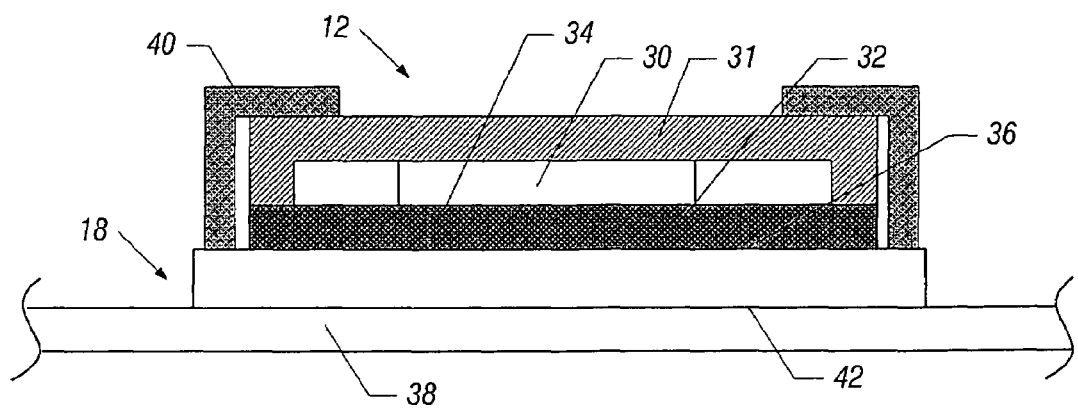
FIG. 8 is a vertical cross-section through a portion of a motherboard with a processor mounted thereon, in accordance with one embodiment.

Referring to FIG. 8, in accordance with some embodiments of the present invention, the technology described above may be utilized to electrically couple an integrated circuit to a printed circuit board such as a motherboard. For example, in FIG. 8, the printed circuit board 38 may be a motherboard. A component 18, in the form of a socket which contains many contacts, may be situated on the printed circuit board 18, and the contacts are connected to the motherboard 38 by suitable electrical connections (such as solder joints) along the interface 42. Input/output (I/O), power, and ground connections may be supplied through the socket contacts.

Also mounted on the socket 18 may be a substrate 32, an integrated circuit chip 30, and heat spreader 31 which, together, make up the component 12. The interface 36 may include the connections between the elements 14a and 20. A frame 40 which is part of the socket 18 may be applied over the heat spreader 31 to supply a force to hold the component 12 on the component 18.

In one embodiment of the present invention, the component 12 may be a land grid array package using an array of terminals called landside pads in the interface 36. An array of contacts, in the form of contacts 20, may be formed on the socket 18 that mate with the elements 14*a* on the component 12.

The contacts on the socket 18, along the interface 42, in one embodiment, may be fabricated from a metal (such as copper-beryllium alloys) or other suitable material and are coupled to the socket 18. The contacts provide all the electrical connections including I/O, power and ground between the component 12 and the motherboard 38.

Figure 9:
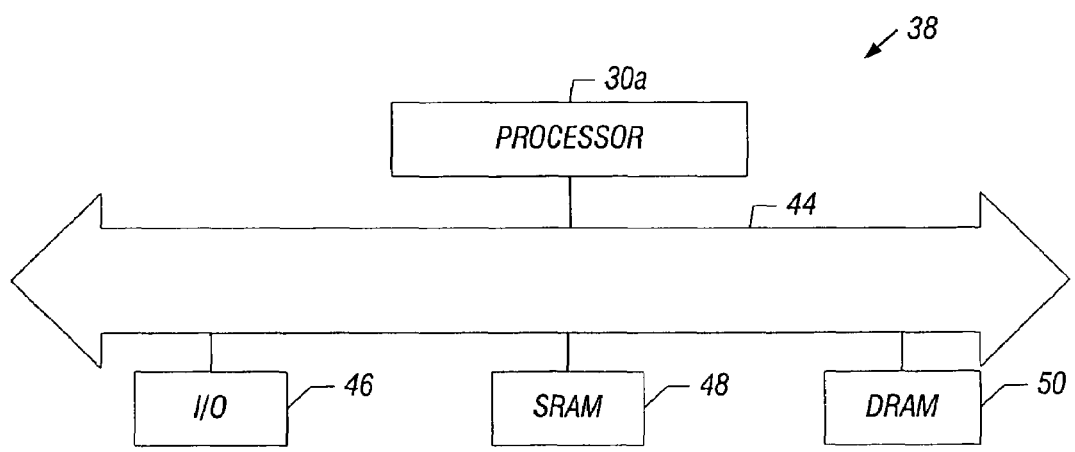
FIG. 9 is a system depiction for one embodiment.

In one embodiment, the chip 30 is a processor coupled to the motherboard 38. As shown in FIG. 9, the motherboard 38 may include connections 44 to other devices including a memory such as a dynamic random access memory 48, a static random access memory 50, and an I/O interface 46. Thus, a processor 30*a* may be coupled to other devices through the motherboard 38.

Thus, in some embodiments, the contact includes a cylindrical portion which makes contact near its end with the raised edge of the landside pad. The cylindrical portion is less than an entire cylinder and may only be a 60° portion of a cylinder. The flat end of the contact makes contact with the landside pad flat portion. Thus, two transverse surfaces contact, increasing the efficiency of the electrical connection. That is, the cylindrical portions of the raised edge and the contact, as well as the free end of the contact and the flat portion of the landside pad. At the same time, the raised edge of the landside pad prevents the contact from slipping off the landside pad, particularly with relatively small landside pads.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A separable electrical connection comprising:
   a first member including a plurality of contacts, each contact including a conductive curved portion having a conductive flat end, said curved portion being a cylindrical segment including only a portion, but not all, of an annulus and forming an arc of less than 360 degrees; and
   a second member electrically connectable to said first member, said second member including a plurality of conductive landside pads, each conductive landside pad including a conductive flat disc shaped portion and a conductive raised edge around said flat disc shaped portion, such that said flat end to abut against said flat disc shaped portion and said curved portion to abut against said raised edge.

2. The connection of claim 1 wherein said curved portion is cylindrical.

3. The connection of claim 1 including a first electrical component coupled to said landside pad and a second electrical component coupled to said contact.

4. The connection of claim 1 wherein said raised edge is ring shaped.

5. The connection of claim 4 wherein said the curved portion and said raised edge have substantially the same radii of curvature.

6. A system comprising:
   a support;
   a socket electrically coupled to said support;
   a component electrically coupled to said socket, said socket including a conductive contact including a conductive curved portion having a conductive flat end, said curved portion being a cylindrical segment including only a portion, but not all, of an annulus and forming an arc of less than 360 degrees, and a conductive landside pad including a conductive flat disc shaped portion and a conductive raised edge around said flat disc shaped portion, such that said flat end to abut against said flat disc shaped portion and said curved portion abuts against said raised edge; and
   a processor coupled to said support.

7. The system of claim 6 wherein said support is a motherboard.

8. The socket of claim 6 wherein said curved portion is cylindrical.

9. The socket of claim 6 wherein said raised edge is ring shaped.

10. The socket of claim 6 wherein said the curved portion and said raised edge have substantially the same radii of curvature.

* * * * *